United States Patent
Tsukihara et al.

(10) Patent No.: US 7,755,067 B2
(45) Date of Patent: Jul. 13, 2010

(54) ION IMPLANTATION APPARATUS AND METHOD OF CONVERGING/SHAPING ION BEAM USED THEREFOR

(75) Inventors: Mitsukuni Tsukihara, Ehime (JP); Takanori Yagita, Ehime (JP); Yoshitaka Amano, Ehime (JP); Mitsuaki Kabasawa, Ehime (JP)

(73) Assignee: SEN Corporation, Tokyo (JP)

(*) Notice: Subject to any disclaimer, the term of this patent is extended or adjusted under 35 U.S.C. 154(b) by 264 days.

(21) Appl. No.: 12/100,861

(22) Filed: Apr. 10, 2008

(65) Prior Publication Data

US 2008/0251734 A1    Oct. 16, 2008

(30) Foreign Application Priority Data

Apr. 10, 2007    (JP)    ............... 2007-103142

(51) Int. Cl.
  *H01J 37/317*    (2006.01)
  *H01J 37/256*    (2006.01)
  *H01L 21/265*    (2006.01)
  *G21K 1/08*    (2006.01)

(52) U.S. Cl. ............ 250/492.21; 250/396 ML; 250/396 R; 250/492.3; 250/281; 250/282

(58) Field of Classification Search ............ 250/492.21, 250/492.3, 396 ML, 396 R, 281, 282
See application file for complete search history.

(56) References Cited

U.S. PATENT DOCUMENTS

| 7,429,743 B2* | 9/2008 | Kabasawa et al. ...... 250/492.21 |
| 2008/0251713 A1* | 10/2008 | Tsukihara et al. ............ 250/282 |
| 2008/0251737 A1* | 10/2008 | Tsukihara et al. ...... 250/492.21 |

FOREIGN PATENT DOCUMENTS

| EP | 0 095 367 A2 | 11/1983 |
| EP | 1 662 545 A2 | 5/2006 |
| EP | 1 691 395 A1 | 8/2006 |
| JP | 2006-156259 A | 6/2006 |

* cited by examiner

*Primary Examiner*—Nikita Wells
(74) *Attorney, Agent, or Firm*—Arent Fox LLP

(57) ABSTRACT

An ion implantation apparatus reciprocally scans an ion beam extracted from an ion source and passed through a mass analysis magnet apparatus and a mass analysis slit and irradiates to a wafer. The ion beam is converged and shaped by providing a first quadrupole vertical focusing electromagnet at a section of a beam line from an outlet of the mass analysis magnet apparatus before incidence of the mass analysis slit and providing a second quadrupole vertical focusing electromagnet having an effective magnetic field effect larger than that of the first quadrupole focusing electromagnet at a section of the beam line from an outlet of the mass analysis slit before incidence on the beam scanner.

19 Claims, 8 Drawing Sheets

ION IMPLANTATION APPARATUS AND METHOD OF CONVERGING/SHAPING ION BEAM USED THEREFOR

This application is based upon and claims the benefit of priority from Japanese patent application No. 2007-103142, filed on Apr. 10, 2007, the disclosure of which is incorporated herein in its entirety by reference.

FIELD OF THE INVENTION

The present invention relates to an ion implantation apparatus, particularly relates to a technology of converging and shaping an ion beam.

DESCRIPTION OF THE RELATED ART

As a method of forming a conductive layer of an n type or a p type at a semiconductor wafer, there is used a so-called ion implantation technology of accelerating a conductive type dopant ionized by an ion source by an electric field to implant to a wafer. According to the ion implantation technology, a plasma is generated by ionizing a gas supplied to an ion source in a plasma chamber, and an ion beam is extracted from the plasma by applying a predetermined voltage to an extracting electrode. Successively, an ion beam comprising an ion having a desired mass is extracted by making the extracted ion beam incident on a mass analysis magnet apparatus, the ion beam is made to pass through a mass analysis slit, thereafter, reciprocally scanned by a beam scanner and irradiated to a wafer to thereby carry out ion implantation (see Patent Reference 1: JP-A-2006-156259).

Meanwhile, as one factor for excellently carrying out ion implantation, there is pointed out a sectional shape of an ion beam irradiated to a wafer. That is, it is necessary to irradiate an ion beam to a wafer in a state of carrying out predetermined converging and shaping with regard to a sectional shape. In order to realize such an operation, an optimum ion beam has been made to be able to be incident on a beam scanner by converging and shaping an ion beam by arranging a pair of quadrupole focusing electromagnets having the same type and the same function at a section of a beam line between the mass analysis magnet apparatus and the beam scanner. Normally, a quadrupole focusing electromagnet of focusing or converging in a longitudinal (vertical) direction is arranged on an upstream side of a beam line and a quadrupole focusing electromagnet for focusing or converging in a lateral direction is arranged on a downstream side thereof.

DISCLOSURE OF THE INVENTION

The method of converging and shaping the ion beam by the pair of quadrupole focusing electromagnets does not bring about a hindrance in converging and shaping the ion beam when an effective diameter of the ion beam is comparatively small. However, when the effective diameter of the ion beam is considerably large, particularly, in a case of an ion beam having a section in an elliptical or flat special shape having a large diameter particularly in a lateral direction, there poses a problem that it is difficult to converge and shape the ion beam as desired while dealing with a difference in an implanting condition of an ion species, a beam amount, a beam energy or the like.

The present invention has been carried out in view of such a problem and it is an object thereof to provide an ion implantation apparatus capable of realizing to converge and shape an ion beam suitable for a beam scanner regardless of a sectional shape of the ion beam.

An ion implantation apparatus according an aspect of the present invention converges and shapes an ion beam of a special sectional shape having a large diameter in a longitudinal or a lateral direction particularly sufficiently in a section of a beam line before incidence on a beam scanner, wherein a first quadrupole focusing electromagnet is provided at a section of a beam line from an outlet of a mass analysis magnet apparatus before incidence on a mass analysis slit, a second quadrupole focusing electromagnet having an effective magnetic field effect larger than that of the first quadrupole focusing electromagnet is provided between a section of the beam line from an outlet of the mass analysis slit to before incidence on the beam scanner to thereby converge and shape the ion beam.

The ion implantation apparatus according to the present invention may be realized in the following aspects.

(Aspect 1)
An effective magnetic field section in the beam line of the second quadrupole focusing electromagnet may be longer than an effective magnetic field section of the first quadrupole focusing electromagnet.

(Aspect 2)
The effective magnetic field effect may be defined by a magnetic flux density or a length of an effective magnetic field section having a uniform magnetic field.

(Aspect 3)
The effective magnetic field effect may be increased by making a diameter of a magnetic core of the second quadrupole focusing electromagnet larger than a diameter of a magnetic core of the first quadrupole focusing electromagnet.

(Aspect 4)
The effective magnetic field effect may be increased by making a magnetic core of the second quadrupole focusing electromagnet longer than a magnetic core of the first quadrupole focusing electromagnet in a direction of the beam line.

(Aspect 5)
The effective magnetic field effect may be increased by making a turn number of a winding of the second quadrupole focusing electromagnet larger than a turn number of a winding of the first quadrupole focusing electromagnet.

(Aspect 6)
The effective magnetic field effect may be increased by making an exciting voltage or current of the second quadrupole focusing electromagnet larger than an exciting voltage or current of the first quadrupole focusing electromagnet.

(Aspect 7)
A magnitude of the effective magnetic field effect of the second quadrupole focusing electromagnet may be made to be twice as much or more of a magnitude of the effective magnetic field effect of the first quadrupole focusing electromagnet.

(Aspect 8)
The second quadrupole focusing electromagnet may be constituted by aligning to arrange two of constitutions the same as the first quadrupole focusing electromagnet in the direction of the beam line.

(Aspect 9)
The second quadrupole focusing electromagnet may be constituted by an electromagnet for converging in a longitudinal direction and a range of converging the ion beam in the longitudinal direction is widened.

(Aspect 10)

The first quadrupole focusing electromagnet and the second quadrupole focusing electromagnet may be respectively electromagnets for converging in a longitudinal direction.

(Aspect 11)

The first quadrupole focusing electromagnet and the second quadrupole focusing electromagnet may be respectively an electromagnet for converging in a longitudinal direction and an electromagnet for converging in a lateral direction.

(Aspect 12)

The first quadrupole focusing electromagnet and the second quadrupole focusing electromagnet may be respectively an electromagnet for converging in a lateral direction and an electromagnet for converging in a longitudinal direction.

(Aspect 13)

The first quadrupole focusing electromagnet and the second quadrupole focusing electromagnet may be respectively electromagnets for converging in a lateral direction.

(Aspect 14)

The second quadrupole focusing electromagnet may be arranged at a position of a middle state of converging and diverging the ion beam, on the section of the beam line from the outlet of the mass analysis slit to the inlet of the beam scanner.

(Aspect 15)

The second quadrupole focusing electromagnet may be an electromagnet for converging in a longitudinal direction. In this case, the beam scanner may include a pair of scanning electrodes arranged by interposing the ion beam, scanner suppression electrodes respectively provided at a vicinity on an upstream side and at a vicinity on a downstream side of the pair of scanning electrodes, and a pair of electric field correcting electrodes connected to the scanner suppression electrodes and provided at a space interposed by electrode faces of the pair of scanning electrodes opposed to each other. The beam scanner may be made to be operated as a lateral direction converging means for alleviating conversion in a longitudinal direction of the second quadrupole focusing electromagnet by a zero electric field effect when a beam scanning angle by the pair of scanning electrodes is zero.

(Aspect 16)

The steering coil for adjusting a beam position of the ion beam in the lateral direction may be arranged at a position on an upstream side adjacent to an inlet of the second quadrupole focusing electromagnet.

(Aspect 17)

A method of converging and shaping an ion beam in an ion implantation apparatus is provided. The method is applied to an ion implantation apparatus for implanting an ion to a wafer by irradiating an ion beam extracted from an ion source and passed through a mass analysis magnet apparatus and a mass analysis slit to the wafer by reciprocally scanning the ion beam with a beam scanner. The ion beam is converged in a longitudinal direction by a first quadrupole focusing electromagnet arranged at a section of a beam line from an outlet of the mass analysis magnet apparatus before incidence of the mass analysis slit. The ion beam is made to be able to be shaped to a sectional shape suitable for the beam scanner by further converging the ion beam in a longitudinal direction by a second quadrupole focusing electromagnet arranged at a section of the beam line from an outlet of the mass analysis slit before incidence of the beam scanner and having an effective magnetic field effect larger than an effective magnetic field effect of the first quadrupole focusing electromagnet.

According to the ion implantation apparatus of the present invention, by making the effective magnetic field effect of the second quadrupole focusing electromagnet larger than the effective magnetic field effect by the first quadrupole focusing electromagnet, a converging force of the second quadrupole focusing electromagnet becomes larger than a converging force of the first quadrupole focusing electromagnet. Therefore, the second quadrupole focusing electromagnet can converge the ion beam more than the first quadrupole focusing electromagnet. Therefore, even when a sectional shape of the ion beam incident on the second quadrupole focusing electromagnet differs by a difference in a beam energy or an ion species of the ion beam, further, a difference in a slit size of the mass analysis slit, the ion beam can be converged by the second quadrupole focusing electromagnet, and therefore, an ion beam optimum for the beam scanner can be supplied.

DETAILED DESCRIPTION OF THE EXEMPLARY EMBODIMENTS

Figures 1A, 1B:
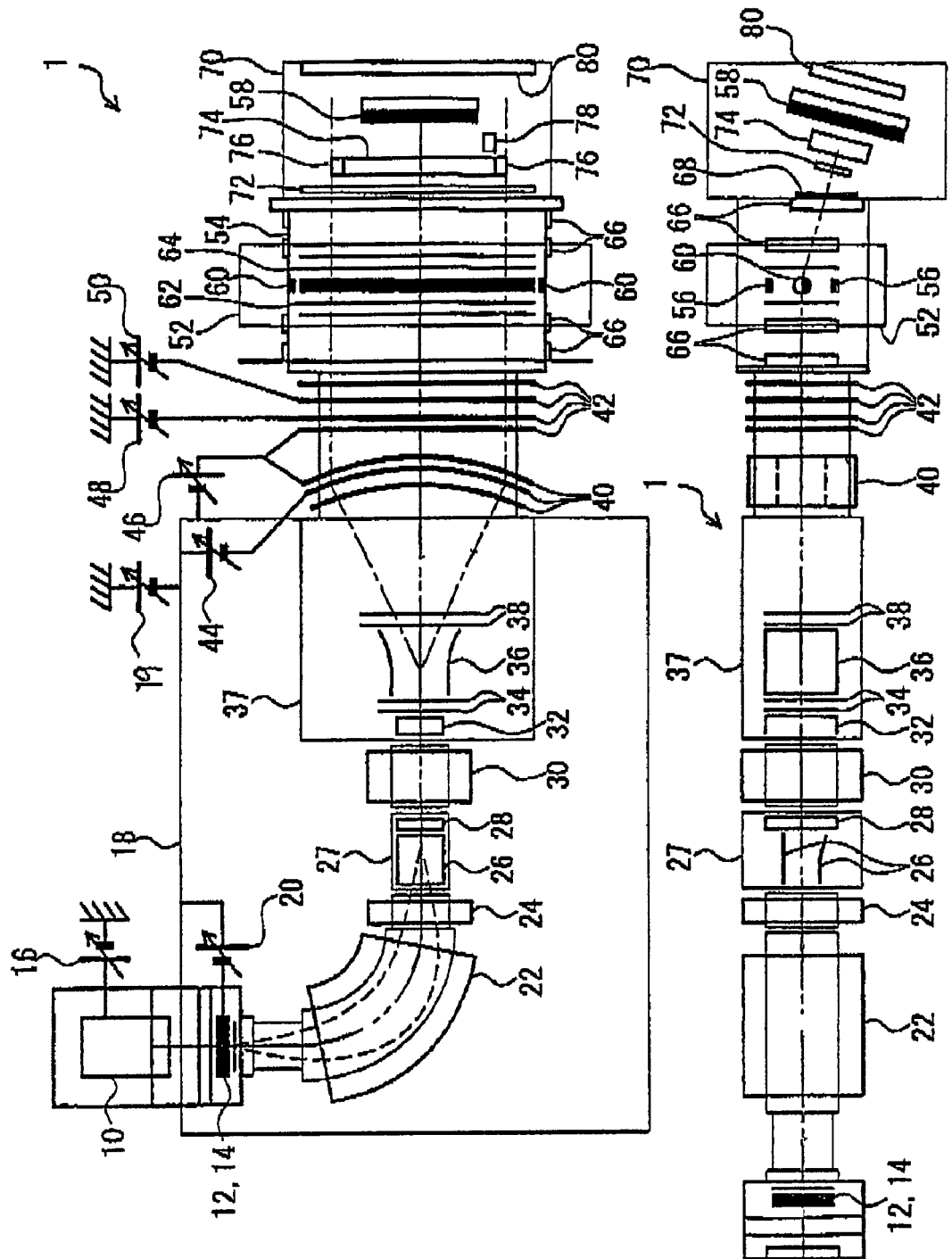
FIG. 1A is a plane view schematically showing a constitution when the present invention is applied to an ion implantation apparatus of a single wafer type and FIG. 1B is a view schematically showing the ion implantation apparatus shown in FIG. 1A from aside face thereof.

An embodiment of an ion implantation apparatus according to the present invention will be explained in reference to the drawings as follows. FIG. 1A and FIG. 1B are schematic views when the present invention is applied to an ion implantation apparatus of a single wafer type, particularly, FIG. 1A is a plane view and FIG. 1B is a side view. A constitution of the ion implantation apparatus 1 will be explained from the most upstream side of a beam line constituting a start point by an ion source 10. An outlet side of the ion source 10 is provided with an extracting electrode 12 for extracting an ion beam from a plasma generated at inside of an ion chamber. A vicinity of a downstream side of the extracting electrode 12 is provided with a suppression electrode 14 for restraining an electron included in the ion beam extracted from the extracting electrode 12 from flowing back to the extracting electrode 12. The ion source 10 is connected with an ion source high voltage power source 16 and an extracting power source 20 is connected to between the extracting electrode 12 and a terminal 18.

A downstream side of the extracting electrode 12 is arranged with a mass analysis magnet apparatus 22 for extracting an ion beam comprising a desired ion by separating an ion other than the desired ion from an incident ion beam. A downstream side of the mass analysis magnet apparatus 22 is arranged with a first quadrupole vertical focusing electromagnet 24 for focusing or converging an ion beam in a longitudinal (vertical) direction, a park electrode 26 for deflecting an ion beam from a beam trajectory line, a mass analysis slit 28 for passing an ion beam comprising an ion of a desired mass in the ion beam, and a second quadrupole vertical focusing electromagnet 30 for focusing or converging an ion beam in a longitudinal direction. The park electrode 26 and the mass analysis slit 28 are contained in a park housing 27 constituted by a material in which cross contamination of aluminum or the like is hardly present. Further, as the mass analysis slit 28, other than an exclusive slit of a fixed type, a plurality of stages of switching type mass analysis slits may be used. According to the plurality of stages of the switching type mass analysis slits, three stages of slit sizes of, for example, an elliptical/or an oval type slit for high beam current, a long and narrow circular slit for a low beam current, and an extremely small diameter slit for confirming a beam trajectory axis are mechanically switched.

A downstream side of the second quadrupole vertical focusing electromagnet 30 is arranged with an injector flag Faraday cup 32 for shutting off an ion beam as necessary and measuring a beam current, and a beam scanner 36 for periodically reciprocating to scan the ion beam in a horizontal direction orthogonal to a direction of advancing the ion beam. An upstream side and a downstream side of the beam scanner 36 are respectively provided with scanner suppression electrodes 34 and 38 having openings capable of restricting also a size of a sectional size of the ion beam, restraining diversion of the ion beam and shielding a scanning electric field from a surrounding. Further, the injector flag Faraday cup 32 is made to be able to be inserted and taken out to and from the beam line by a drive mechanism in an up and down direction in this case as explained later. Further, the injector flag Faraday cup 32, the beam scanner 36 and the scanner suppression electrodes 34 and 38 are contained in a scanner housing 37 made of aluminum.

Respective members on the beam line from the extracting electrode 12 to the scanner housing 37 are contained in the terminal 18. The terminal 18 is connected with a terminal power source 19. Therefore, potentials of the park housing 27 and the scanner housing 37 are the same as a potential of the terminal 18 to constitute the potential of the terminal power source 19.

A downstream side of the beam scanner 36 is arranged with a parallel lens 40 for redeflecting an ion beam deflected to have an angle in a horizontal direction relative to a center trajectory (center trajectory of ion beam before being scanned by the beam scanner 36) to be in parallel with the center trajectory, and an accelerating/decelerating column 42 for accelerating or decelerating the ion beam. The parallel lens 40 is constituted by a plurality of electrodes in a circular arc shape bored with holes for passing the ion beam at centers thereof. A first electrode from an upstream side of the parallel lens 40 is maintained at the terminal potential. A second electrode is referred to as a suppression electrode for restraining an electron from flowing in by being connected with the suppression power source 44. A third electrode is connected with a parallel lens power source 46, thereby, an electric field is generated between the second electrode and the third electrode, and an ion beam deflected in a horizontal direction becomes an ion beam in parallel with a center trajectory before being deflected. The parallel lens 40 is constructed by a structure of utilizing the electric field and the ion beam is decelerated by a potential difference between the second electrode and the third electrode. That is, the ion beam deflected by the beam scanner 36 is corrected in a trajectory thereof in a direction in parallel with a center trajectory before being deflected by the electric field between the second electrode and the third electrode and decelerated.

The accelerating/decelerating column 42 is constituted by one or more of electrodes in a linear shape. A first electrode from an upstream side of the accelerating/decelerating column 42 is connected with the parallel lens power source 46 similar to the third electrode of the parallel lens 40. Second and third electrodes are respectively connected with a first accelerating/decelerating column power source 48 and a second accelerating/decelerating column power source 50. The ion beam is accelerated or decelerated by adjusting voltages of the power sources. Further, a fourth electrode is grounded to a ground potential. A downstream side of the accelerating/decelerating column 42 is arranged with an angular energy filter (hereinafter, referred to as AEF) 52 of a hybrid type. AEF 52 is an energy filter for selecting the ion beam achieving an aimed acceleration energy. AEF 52 includes a magnetic deflecting electromagnet for magnetic field deflection and a static deflecting electrode for static deflection. The magnetic deflecting electromagnet is arranged to surround an AEF chamber 54 and is constituted by a yoke member surrounding upper and lower and left and right sides of the AEF chamber 54 and a group of coils wound around the yoke member. Further, the magnetic deflecting electromagnet is connected with a direct current voltage power source (not illustrated).

On the other hand, the static deflecting electrode is constituted by a pair of upper and lower AEF electrodes 56 and arranged to interpose an ion beam from up and down directions. In the pair of AEF electrodes 56, the AEF electrode 56 on an upper side is applied with a positive voltage and the AEF electrode 56 on a lower side is applied with a negative voltage, respectively. In deflecting by a magnetic field, an ion beam is deflected to a lower side by about 20 degrees by the magnetic field from the magnetic deflecting electromagnet and only an ion beam of an aimed energy is selected. On the other hand, in deflecting by the magnetic field and the electric field, or only the electric field, the ion beam is deflected to the lower side by about 20 degrees by a combining operation by the magnetic field from the magnetic deflecting electromagnet and the electric field generated between the pair of AEF electrodes 56, or a deflecting operation of the electric field and only an ion beam of an aimed energy is selected.

In this way, AEF 52 is of the hybrid type using the magnetic field, the electric field, and both of the magnetic field and the electric field as necessary, and therefore, in transporting a low energy beam, the magnetic field having a high electron confining effect can mainly be used and in transporting a high energy beam, in addition to using both of the magnetic field deflection and the static deflection, a deflecting operation of only the electric field can be used. Further, a way of use differs by an energy or a kind of a gas of the ion source 10 when the magnetic field is always used, or when both of the magnetic field and the electric field is used or the deflecting operation of only the electric field is used.

AEF 52 is provided with an AEF plasma shower 60 for promoting an efficiency of transporting an ion beam to a wafer 58 by restraining diversion of the ion beam by supplying an electron. Further, AEF 52 is respectively provided with AEF suppression electrodes 62 and 64 on an upstream side and a downstream side of the AEF plasma shower 60. The AEF suppression electrodes 62 and 64 mainly serve to restrict an electron barrier and a size of a sectional shape of the ion beam.

A wall of the AEF chamber 54 is arranged with a plurality of permanent magnets 66 for forming a cusp magnetic field. By forming the cusp magnetic field, an electron is confined to inside of the AEF chamber 54. The respective permanent magnets 66 are arranged such that magnetic poles thereof are directed to inside of the AEF chamber 54 and the contiguous magnetic poles have opposite magnetic poles. Further, an outlet side of the AEF chamber 54 is provided with a striker plate 68 for receiving a neutral particle or the like constituted by neutralizing an ion advancing straight without being deflected by AEF 52.

A processing chamber (vacuum processing chamber) 70 is connected with the AEF chamber 54. Selectable energy slits (hereinafter, referred to as SES) 72 are arranged at inside of the processing chamber 70. The selectable energy slits 72 are arranged to interpose the ion beam from up and down directions. Upper and lower selectable slits each includes 4 of slit faces, after selecting the slit face, by further adjusting axes of the upper and lower selectable slits in the up and down direction, and rotating the axes, a desired slit width is provided. By successively selecting 4 of the silt faces in accordance with a species of an ion, cross contamination is reduced.

A plasma shower 74 supplies a low energy electron to a front face of the wafer 58 along with the ion beam, neutralizes and restrains charge up of a positive charge produced by ion implanting. Dose cups 76 respectively arranged at left and right ends of the plasma shower 74 measure a dose amount. Specifically, the dose cup is connected with a current measurement circuit and the dose amount is measured by measuring a beam current which flows by making the ion beam incident thereon.

A beam profiler 78 includes a beam profiler cup (not illustrated) for measuring the beam current at an ion implanting position and a vertical profile cup (not illustrated) for measuring a beam shape and a beam X-Y position. The beam profiler 78 measures an ion beam density at the ion implanting position while being moved in a horizontal direction before implanting an ion or the like. When a predicted non uniformity (PNU) of the ion beam does not satisfy a request of the process as a result of measuring the beam profile, an applied voltage or the like of the beam scanner 36 is automatically adjusted to satisfy a process condition. The vertical profiler cup confirms a beam width and a beam center position by measuring the beam shape at the ion implanting position.

The most downstream side of the beam line is arranged with a triple surface beam dump (TSBD) 80 having a beam current measurement function similar to that of a Faraday cup for measuring a final setup beam. The triple surface beam dump 80 reduces cross contamination by switching three faces of a triangular pillar in accordance with a kind of a gas of the ion source 10. Further, the beam line is naturally maintained in high vacuum.

According to an ion implantation of the related art, a sectional shape of an ion beam incident on a beam scanner is changed by high or low of a beam energy of the ion beam, a difference in an ion species (for example, P, B, As or the like), large or small of a beam size and large or small of a beam current density, and a difference in a slit size of a mass analysis slit and it is not simple to irradiate the ion beam to a wafer in a uniform state.

In contrast thereto, according to an ion implantation apparatus 1 of the embodiment, by converging the ion beam in the longitudinal direction by the first quadrupole vertical focusing electromagnet 24 and further converging the ion beam in the longitudinal direction by the second quadrupole vertical focusing electromagnet 30 having a large effective magnetic field effect, an optimum ion beam, that is, a uniform ion beam having a small change in a sectional shape can be made to be incident on the beam scanner 36. Particularly, various ion beams are made to be able to deal with by widening a converging range in the longitudinal direction by making the effective magnetic field effect of the second quadrupole focusing electromagnet 30 twice or more of the effective magnetic field effect of the first quadrupole vertical focusing electromagnet 24. A specific constitution for realizing this will be explained as follows.

Figure 2A:
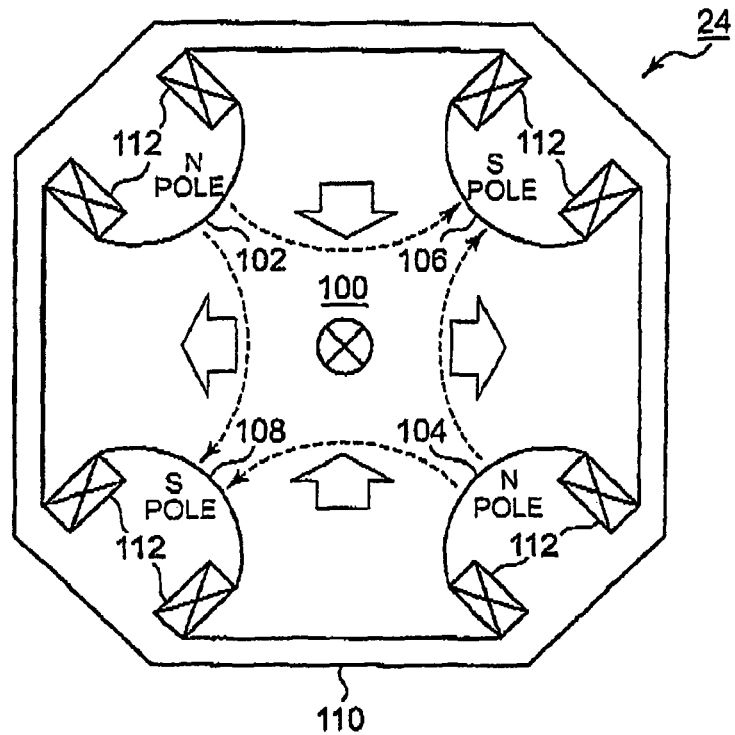
FIG. 2A is a front view showing a first quadrupole vertical focusing electromagnet shown in FIG. 1.
Figure 2B:
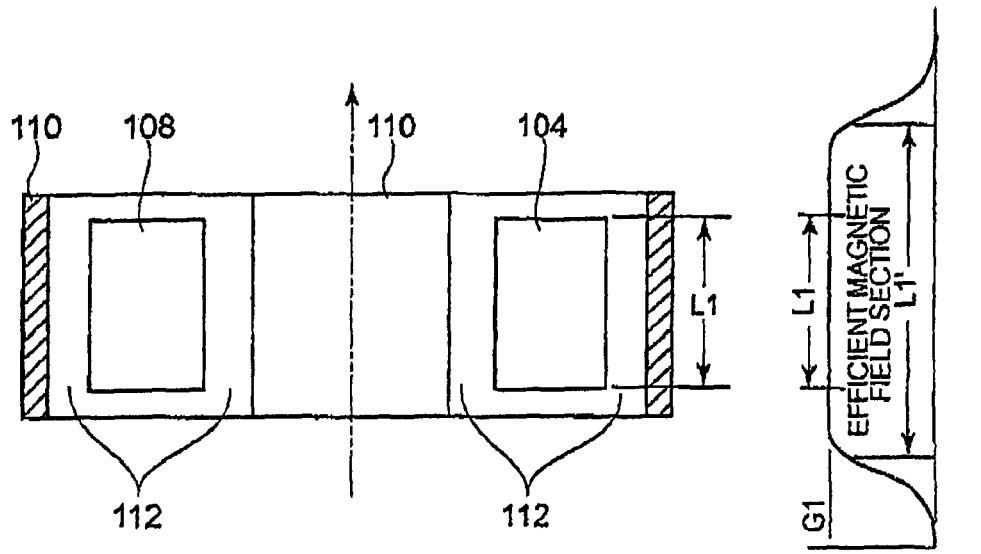
FIG. 2B is a view showing cross-sectional faces of two electromagnets of the first quadrupole vertical focusing electromagnet and showing a relationship between a length in an ion beam advancing direction of a magnetic flux density of the first quadrupole vertical focusing electromagnet.

FIG. 2A is a front view showing a first quadrupole vertical focusing electromagnet 24, and FIG. 2B is a view showing cross-sectional faces of two electromagnets of the first quadrupole vertical focusing electromagnet 24 (left side of drawing) and showing a relationship between a length in an ion beam advancing direction and a magnetic flux density of the first quadrupole vertical focusing electromagnets 24 (right side of drawing).

As shown by FIG. 2A, the first quadrupole vertical focusing electromagnet 24 is formed with a space 100 for passing an ion beam at a center thereof and is formed substantially in an octagonal shape. Further, the first quadrupole vertical focusing electromagnet 24 includes two of N pole magnetic cores 102 and 104 and two of S pole magnetic cores 106 and 108 opposed to each other and generates magnetic fields directed from front ends of the two N pole magnetic cores 102 and 104 to the two S pole magnetic cores 106 and 108 as shown by arrow marks of broken lines. The N pole magnetic cores 102 and 104 and the S poles magnetic cores 106 and 108 are respectively wound with windings 112 therefore and rear ends of the respective magnetic cores are coupled by a yoke 110. Here, a direction of a beam current is defined as a direction of moving a positive charge, and therefore, a case of advancing an ion beam from a surface to a rear face side of the drawing is the same as a case of making a beam current flow from the surface side to the rear face side. In FIG. 2A, the direction of advancing the ion beam directed from the surface side to the rear face side is indicated by a sign putting x to inside of ○.

According to an arrangement of the magnetic poles shown in FIG. 2A, when the ion beam advances from the surface side to the rear face side, by Fleming's left-hand rule, a force of converging the ion beam in a longitudinal direction is generated. That is, the ion beam is received with a force in a lower direction by a magnetic field from the magnetic pole end of the N pole magnetic core 102 to the S pole magnetic core 106 and the ion beam is received with a force in an upper direction by the magnetic field directed from the magnetic pole end of the N pole magnetic core 104 to the S pole magnetic core 108. On the other hand, the ion beam is received with a force in a left direction by the magnetic field directed from the magnetic pole end of the N pole magnetic core 102 to the S pole magnetic core 108 and the ion beam is received with a force in a right direction by the magnetic field directed from the magnetic pole end of the N pole magnetic core 104 to the S pole magnetic core 106. As a result, as shown by white arrow marks in FIG. 2A, the ion beam is received with the forces of converging in the longitudinal direction and received with the forces of diverging in the left and right (lateral) direction. Further, the N magnetic cores 102 and 104 and the S pole magnetic cores 106 and 108 of the first quadrupole vertical focusing electromagnet 24 have a length L1 with regard to the direction of advancing the ion beam indicated by a two-dotted chain line on a left side of FIG. 2B. In the following explanation, there is a case in which the length L1 of the respective magnetic cores is referred to as an extended length of the first quadrupole vertical focusing electromagnet 24 in the advancing direction of the ion beam.

Figure 3:
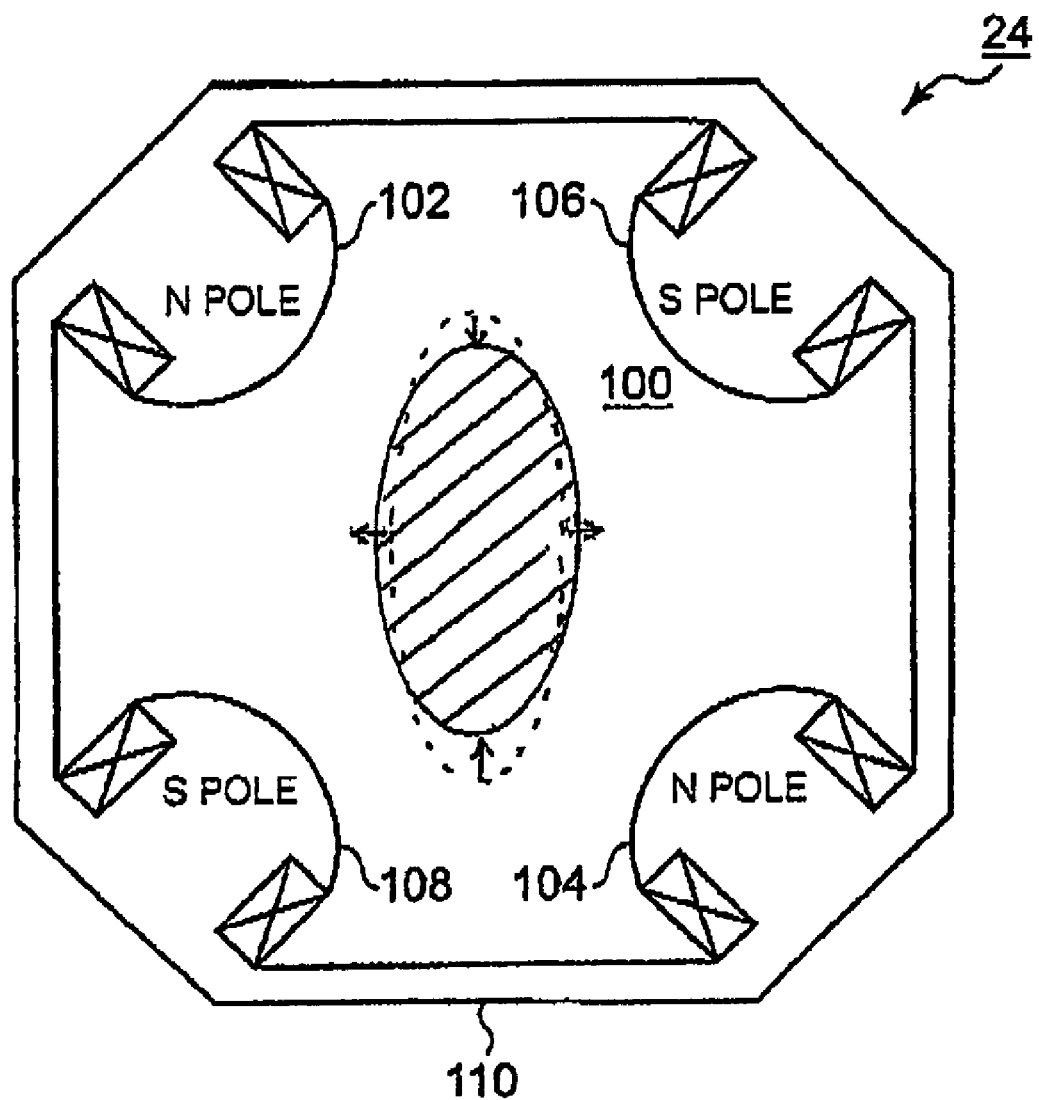
FIG. 3 is a view for explaining a behavior of converging an ion beam in a longitudinal direction at the first quadrupole vertical focusing electromagnet.

FIG. 3 is a view for explaining a behavior of converging the ion beam in the longitudinal direction by the first quadrupole vertical focusing electromagnet 24. As shown by FIG. 3, when the ion beam having a section of a vertically prolonged elliptical shape indicated by a broken line is made to pass through the space 100 of the first quadrupole vertical focusing electromagnet 24, the ion beam becomes an ion beam having a section of a vertically prolonged elliptical shape indicated by hatchings by a converging force by an operation of the first quadrupole vertical focusing electromagnet 24.

Figure 4A:
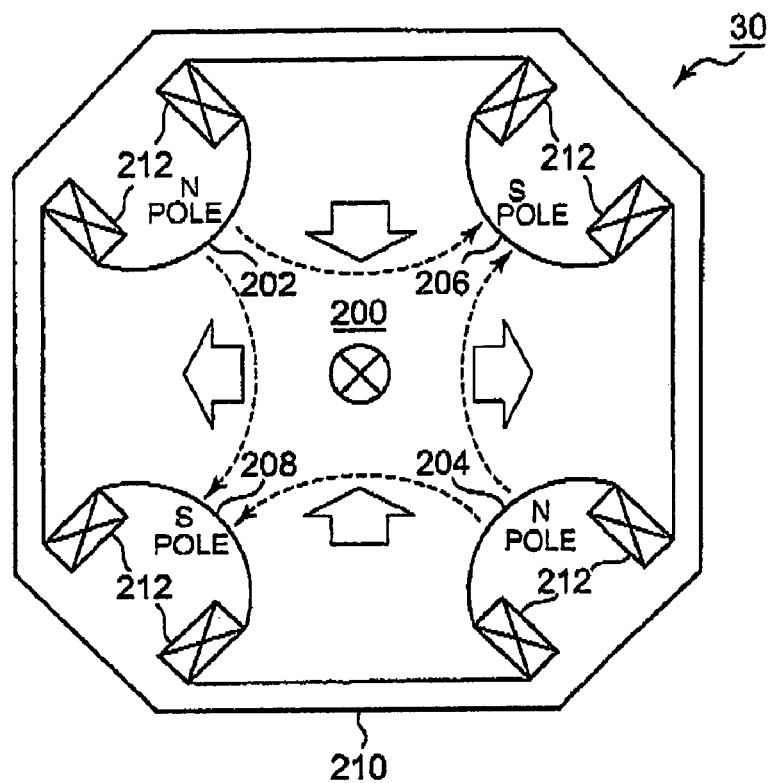
FIG. 4A is a front view showing a second quadrupole vertical focusing electromagnet shown in FIG. 1.
Figure 4B:
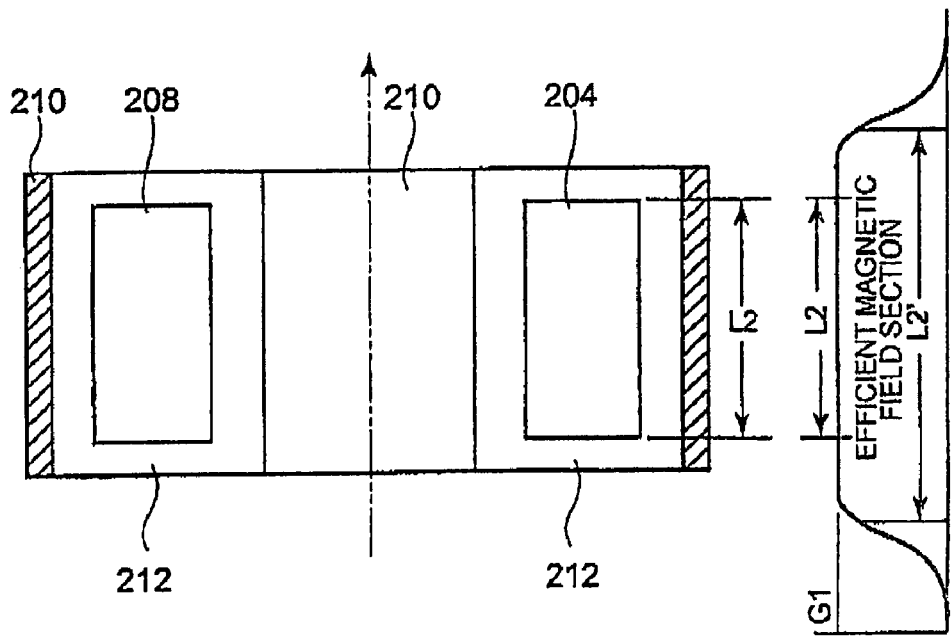
FIG. 4B is a view showing cross-sectional faces of two electromagnets of the second quadrupole vertical focusing electromagnet and showing a relationship between a length in an ion beam advancing direction and a magnetic flux density of the second quadrupole vertical focusing electromagnet.

FIG. 4A is a front view showing the second quadrupole vertical focusing electromagnet 30, and FIG. 4B is a view showing cross-sectional faces of two electromagnets of the second quadrupole vertical focusing electromagnet 30 (left side of the drawing) and showing a relationship between a length in an ion beam advancing direction and a magnetic flux density of the second quadrupole vertical focusing electromagnet 30 (right side of the drawing). As shown by FIG. 4A, the second quadrupole vertical focusing electromagnet 30 is formed with a space 200 for passing the ion beam at a center thereof and is formed substantially in an octagonal shape. Further, the second quadrupole vertical focusing electromagnet 30 includes two of N pole magnetic cores 202 and 204 and two of S pole magnetic cores 206 and 208 and generates magnetic fields directed from magnetic pole ends of the two N pole magnetic cores 202 and 204 to the two S pole magnetic cores 206 and 208. The N pole magnetic cores 202 and 204 and the S pole magnetic cores 206 and 208 are respectively wound with windings 212 therefore and rear ends of the respective magnetic cores are coupled by a yoke 210. Further, in FIG. 4B, the N pole magnetic cores 202 and 204 and the S pole magnetic cores 206 and 208 of the second quadrupole vertical focusing electromagnet 30 have a length L2 in a direction of advancing an ion beam indicated by a two-dotted chain line. Also in the second quadrupole vertical focusing electromagnet 30, there is a case in which the length L2 of the respective magnetic cores is referred to as an extended length of the second quadrupole vertical focusing electromagnet 30 in the direction of advancing the ion beam.

Here, a constitution of the second quadrupole vertical focusing electromagnet 30 will be explained in comparison with a constitution of the first quadrupole vertical focusing electromagnet 24. The extended length L2 of the second quadrupole vertical focusing electromagnet 30 shown in FIG. 4B is made to be twice as much as the extended length L1 of the first quadrupole vertical focusing electromagnet 24 shown in FIG. 2B. A turn number of the winding 212 of the second quadrupole vertical focusing electromagnet 30 is the same as a turn number of the winding 112 of the first quadrupole vertical focusing electromagnet 24. Naturally, also diameters of the windings 112 and 212 are the same. An exciting current flowing in the winding 212 of the second quadrupole vertical focusing electromagnet 30 is the same as an exciting current flowing in the winding 112 of the first quadrupole vertical focusing electromagnet 24. As a result, a magnetic flux density passing through the yoke 210 of the second quadrupole vertical focusing electromagnet 30 is the same as a magnetic flux density passing through the yoke 110 of the first quadrupole vertical focusing electromagnet 24. However, as described above, the extended length L2 of the second quadrupole vertical focusing electromagnet 30 is twice as much as the extended length L1 of the first quadrupole vertical focusing electromagnet 24. Therefore, when the ion beams pass through the space 100 of the first quadrupole vertical focusing electromagnet 24 and the space 200 of the second quadrupole vertical focusing electromagnet 30 by the same speed, a time period of passing the space 200 of the second quadrupole vertical focusing electromagnet 30 becomes twice as much as a time period of passing the space 100 of the first quadrupole vertical focusing electromagnet 24. This signifies that as shown by right sides of FIG. 2B and FIG. 4B, even when a magnetic flux density G1 of the second quadrupole vertical focusing electromagnet 30 is the same as that of the first quadrupole vertical focusing electromagnet 24, a length of an effective magnetic field section L2' effectively operating to the ion beam, in other words, an effective magnetic field section having a uniform magnetic field achieving an effective magnetic field effect (effective potential length) becomes twice as much as that of the effective magnetic field section L1' of the first quadrupole vertical focusing electromagnet 24. A product of the magnetic flux density G in proportion to the exciting current by the effective magnetic field section L is referred to as a GL product to constitute one index indicating the effective magnetic field effect of the electromagnet.

At any rate, the force received by the ion beam during a time period of passing the space 200 of the second quadrupole vertical focusing electromagnet 30 becomes twice as much as the force received by the ion beam during a time period of passing the space 100 of the first quadrupole vertical focusing electromagnet 24. As a result thereof, even when the magnetic flux density passing through the yoke 210 of the second quadrupole vertical focusing electromagnet 30 is the same as the magnetic flux density passing through the yoke 110 of the first quadrupole vertical focusing electromagnet 24, a converging force operated to the ion beam at the second quadrupole vertical focusing electromagnet 30 becomes twice as much as a converging force operated to the ion beam in the first quadrupole vertical focusing electromagnet 24. Therefore, the second quadrupole vertical focusing electromagnet 30 can converge the ion beam more than the first quadrupole vertical focusing electromagnet 24 and can widen a range of converging the ion beam in the longitudinal direction more than the first quadrupole vertical focusing electromagnet 24.

Figure 5:
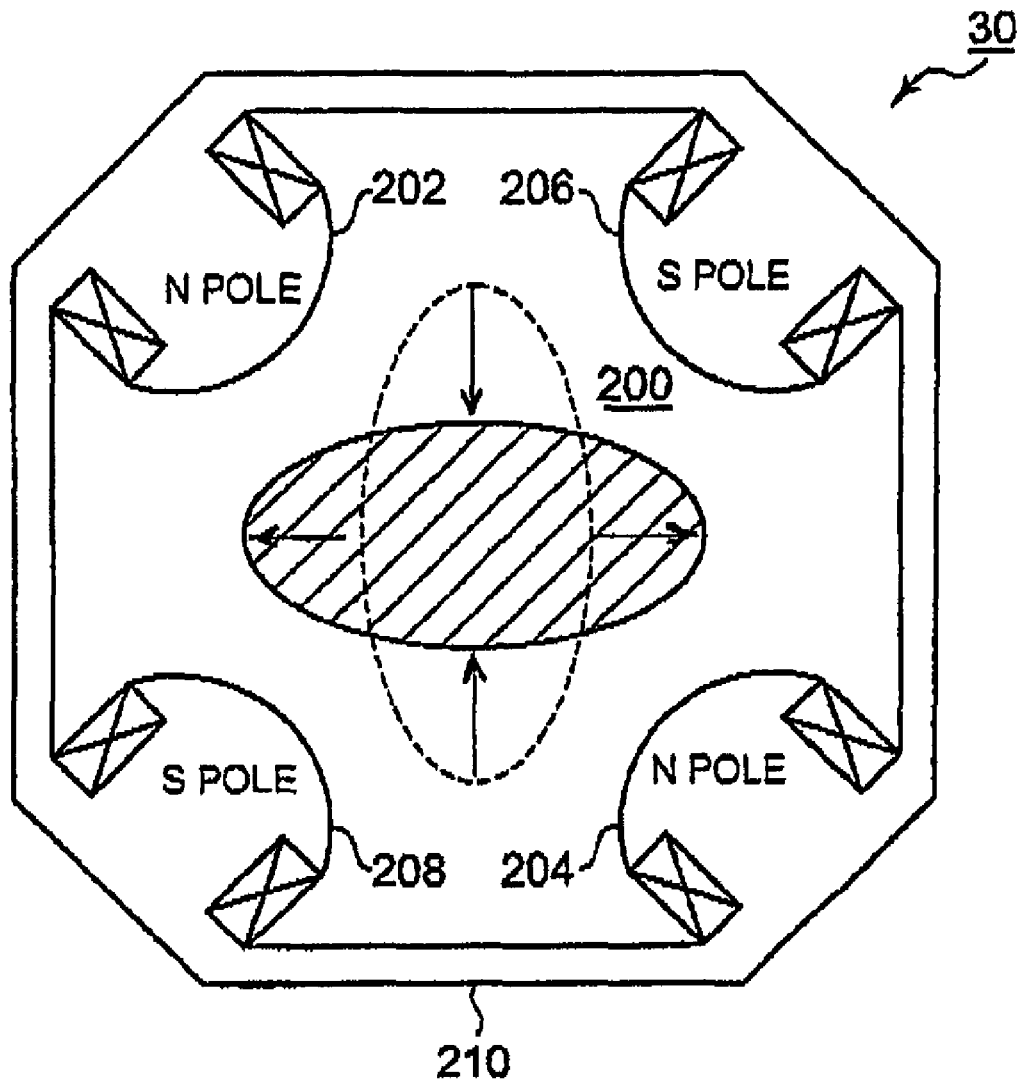
FIG. 5 is a view for explaining a behavior of converging an ion beam in a longitudinal direction by the second quadrupole vertical focusing electromagnet.

FIG. 5 is a view showing a behavior of converging the ion beam in the longitudinal direction by the second quadrupole vertical focusing electromagnet 30. As shown by FIG. 5, when the ion beam having a section in a vertically prolonged elliptical shape indicated by a broken line is made to advance to the space 200 of the second quadrupole vertical focusing electromagnet 30, the ion beam becomes an ion beam having a section having a laterally prolonged elliptical shape indicated by hatchings by a converging force of the second quadrupole vertical focusing electromagnet 30. At this occasion, even when the ion beam advancing to the second quadrupole vertical focusing electromagnet 30 is an ion beam in an elliptical shape larger than that of the ion beam advancing to the space 100 of the first quadrupole vertical focusing electromagnet 24, the converging force of the second quadrupole vertical focusing electromagnet 30 is twice as much as the converging force of the first quadrupole vertical focusing electromagnet 24, and therefore, an ion beam converged and shaped as designed can be provided and the ion beam having an optimum sectional shape can be made to be incident on the beam scanner 36.

As described above, according to an ion implantation apparatus 1 of the embodiment, the ion beam passing through the mass analysis magnet apparatus 22 is converged in the longitudinal direction by the first quadrupole vertical focusing electromagnet 24. Thereafter, the ion beam passes through the park electrode 26 and only an ion beam comprising an ion of a predetermined mass is made to pass through the mass analysis slit 28. The ion beam passing through the mass analysis slit 28 is converged in the longitudinal direction by the second quadrupole vertical focusing electromagnet 30. As described above, the extended length L2 of the second quadrupole vertical focusing electromagnet 30 is twice as much as the extended length L1 of the first quadrupole vertical focusing electromagnet 24, and therefore, when the ion beam passes through the second quadrupole vertical focusing electromagnet 30, the ion beam is converged in the longitudinal direction by the converging force twice as much as the converging force of the first quadrupole vertical focusing electromagnet 24. Therefore, when the sectional shape of the ion beam differs by high or low of the beam energy of the ion beam, large or small of the beam size and large or small of the beam current density, a difference in the ion species or the like, although converging and shaping operation by the first quadrupole vertical focusing electromagnet 24 is small, the ion beam can be converged and shaped to the ion beam as designed by the second quadrupole vertical focusing electromagnet 30 having the large effective magnetic field effect and the optimum ion beam can be made to be incident on the beam scanner 36. This is similar even when the sectional shape of the ion beam differs by a difference in the slit size of the mass analysis slit 28.

Figures 6A, 6B:
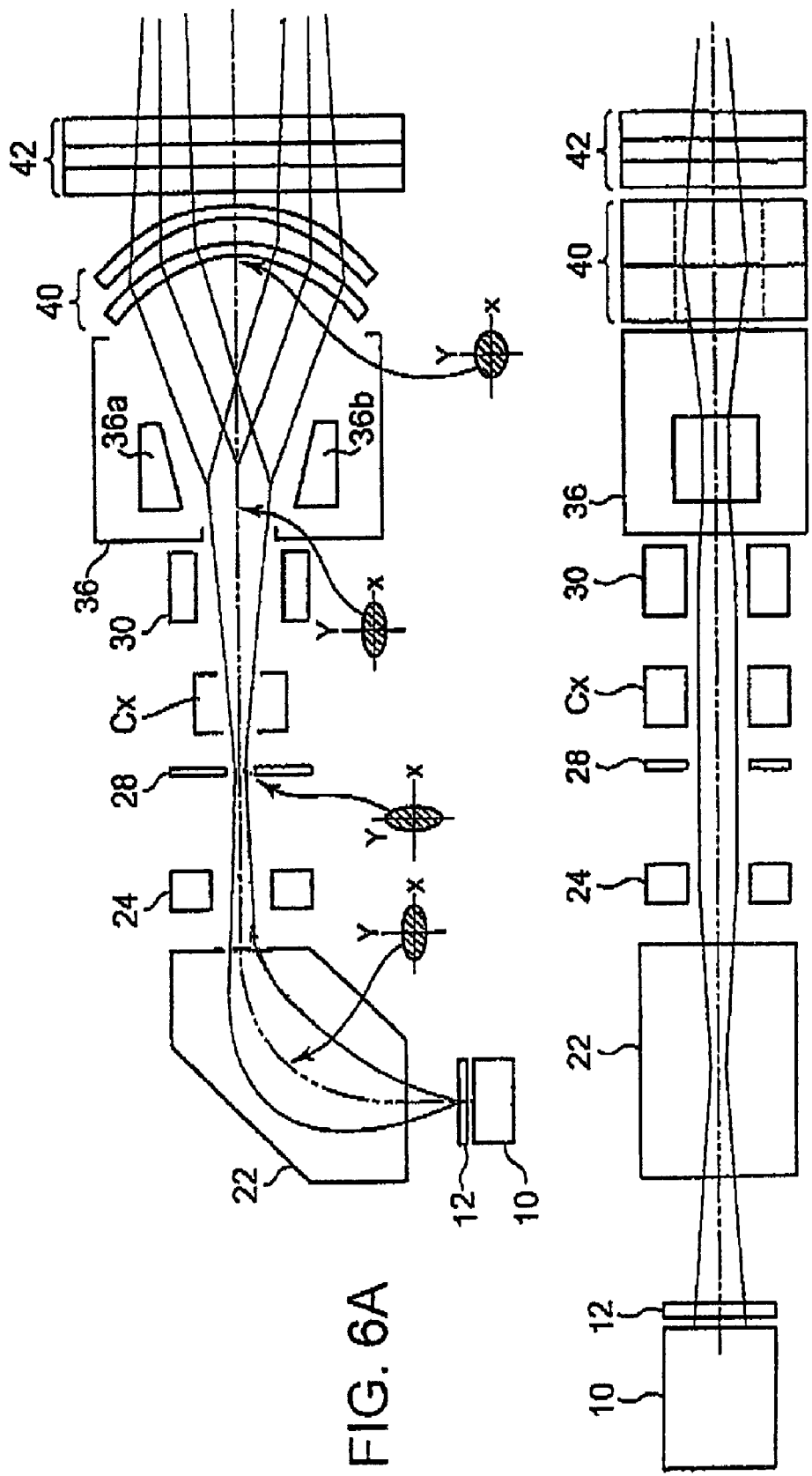
FIG. 6A is a plane view for explaining of converging and shaping an ion beam from a ion source to an accelerating/decelerating column shown in FIG. 1
FIG. 6B is a view viewing an arrangement relationship of FIG. 6A from a side face thereof.

An explanation will be given of converging and shaping the ion beam from the ion source 10 to the accelerating/decelerating column 42 in reference to FIG. 6A and FIG. 6B. FIG. 6A is a view viewing major constituent elements of the ion implantation apparatus and an ion beam passing therethrough from an upper side, FIG. 6B is a view viewing an arrangement relationship of FIG. 6A from a side direction. Further, in order to facilitate understanding, the respective constituent elements are shown by being spaced apart from each other by sufficient intervals thereamong.

The ion beam extracted from the ion source 10 by the extracting electrode 12 enters into the mass analysis magnet apparatus 22. The ion beam is emitted as an ion beam converged in the longitudinal (vertical) direction and diverged in the lateral direction by an operation of an extracting slit provided at the extracting electrode 12. At the mass analysis magnet apparatus 22, the mass analysis is carried out for the incident ion beam and only a necessary ion species is selected. By the vertical converging lens operation of the extracting electrode 12 and a convex lens operation in the lateral direction of the mass analysis magnet apparatus 22, a beam width (diameter) of the ion beam incident on the mass analysis magnet apparatus 22 in the longitudinal direction is minimized at a center position of the mass analysis magnet apparatus 22 and a beam width (diameter) in the lateral direction is maximized. The ion beam passing through the center position of the mass analysis magnet apparatus 22 is diverged in the beam width in the longitudinal direction and converged in the beam width in the lateral direction.

As described above, the first quadrupole vertical focusing electromagnet 24 serves to converge the beam width of the ion beam passed through the mass analysis magnet apparatus 22 in the longitudinal direction and diverges in the lateral direction. That is, as shown by the broken line in FIG. 3, the ion beam having a vertically prolonged sectional shape having the large beam width in the longitudinal direction (diverged in longitudinal direction) and small beam width in the lateral direction (converged in lateral direction) enters into the first quadrupole vertical focusing electromagnet 24. The first quadrupole vertical focusing electromagnet 24 serves to converge the beam width of the ion beam in the longitudinal direction and diverge the beam width in the lateral direction as indicated by hatchings. As a result, the ion beam diverging the beam width in the longitudinal direction and converging the beam width in the lateral direction is maximized in the beam width in the longitudinal direction and minimized in the beam width in the lateral direction at the position of the mass analysis slit 28. When the first quadrupole vertical focusing electromagnet 24 is arranged on an upstream side of the mass analysis slit 28, most of the ion beam having a wide vertical width is made to be able to pass through the mass analysis slit 28. Further, also diversion in the longitudinal direction can be restrained and most of the ion beam is made to pass therethrough in the longitudinal direction. That is, an unnecessary cut or an unnecessary diversion can be prevented.

The ion beam passed through the mass analysis slit 28 is converged in the beam width in the vertical direction since the beam width in the lateral direction which has been converged is changed to be diverged.

The second quadrupole vertical focusing electromagnet 30 serves to converge the beam width of the ion beam passed through the mass analysis slit 28 in the longitudinal direction and diverge the beam width in the lateral direction. That is, as shown by the broken line in FIG. 5, the ion beam having the vertically prolonged sectional shape having a large beam width in the longitudinal direction (diverged in longitudinal direction) and the small beam width in the lateral direction (converged in lateral direction) is made to be entered into the second quadrupole vertical focusing electromagnet 30. The second quadrupole vertical focusing electromagnet 30 serves to converge the beam width of the ion beam in the longitudinal direction and diverge the beam width in the lateral direction as indicated by hatchings. Thereby, the ion beam converged strongly in the longitudinal direction and diverged in the lateral direction, that is, the ion beam sectional shape of which is constituted by an elliptical shape or a flat shape prolonged in the lateral direction is transmitted to the beam scanner 36. Thereby, the ion beam is minimized in the beam width in the longitudinal direction and maximized in the beam width in the lateral direction at a vicinity of an inlet of the beam scanner 36 having a pair of scanning electrodes 36a and 36b, mentioned later, (vicinity of scanner suppression electrode 34 of FIG. 1A). From such a view point, it is preferable that a portion of installing the second quadrupole vertical focusing electromagnet 30 is arranged on a beam line of a section of the beam line from the outlet of the mass analysis slit 28 to before incidence on the beam scanner 36 and at a position in a middle state of converging and diverging the ion beam. This is because a sectional size (size in longitudinal direction) of the ion beam is preferably large in order to effect a large converging force to the ion beam in the longitudinal direction.

FIG. 6A and FIG. 6B show sectional shapes of the ion beam at a center position of the mass analysis magnet apparatus 22, the mass analysis slit 28, the beam scanner 36, and the parallel lens 40 by extracting the sectional shapes by extensions to facilitate understanding. With regard to X, Y attached to the sectional shapes, notation X designates a lateral direction and notation Y designates a longitudinal (vertical) direction.

The beam scanner 36 periodically and reciprocally scans in the lateral direction the ion beam having the sectional shape which is the elliptical shape or the flat shape prolonged in the lateral direction provided as described above.

The ion beam is made to be parallel again to be in parallel with a beam trajectory line before being entered into the beam scanner 36 by the parallel lens 40. That is, the ion beam is made to be in parallel with an axis of an angle of deflection of 0 degree. Further, the ion beam at the position of the parallel lens 40 is constituted by a sectional shape proximate to a circular shape. The ion beam from the parallel lens 40 is transmitted to the AEF 52 (FIG. 1A) by way of the accelerating/decelerating column 42 comprising one or more of electrodes. At the AEF 52, analysis with regard to an energy of the ion beam is carried out and only an ion species of necessary energy is selected.

Meanwhile, the constitution may be constructed as follows although illustration thereof is omitted in FIG. 1A and FIG. 1B. As shown by FIG. 6A and FIG. 6B, the ion beam may be adjusted in the lateral direction by arranging a steering coil Cx for adjusting the beam position in a lateral direction between the mass analysis slit 28 and the second quadrupole vertical focusing electromagnet 30, preferably, at an upstream side position adjacent to the inlet of the second quadrupole vertical focusing electromagnet 30.

Next, although an explanation will be given of an effect by combining the second quadrupole vertical focusing electromagnet 30 and the beam scanner 36, a simple explanation will be given of a constitution and an operation of the beam scanner 36 therebefore.

Figure 7A:
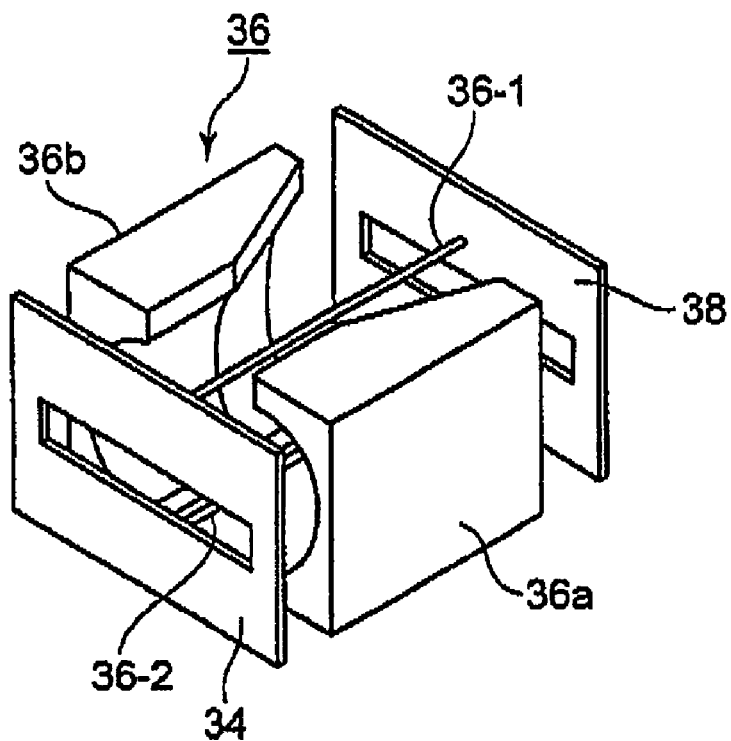
FIG. 7A is a perspective view showing a constitution of a beam scanner.

FIG. 7A is a perspective view showing a constitution of the beam scanner 36. The beam scanner 36 includes the pair of scanning electrodes 36a and 36b arranged to be opposed to each other by interposing the ion beam therebetween, and scanner suppression electrodes 34 and 38 provided respectively at a vicinity on an upstream side and at a vicinity on a downstream side of the pair of scanning electrodes 36a and 36b to interpose the scanning electrodes 36a and 36b. The beam scanner 36 further includes electric field correcting electrodes 36-1 and 36-2 for restraining a zero electric field effect extended in parallel with the beam trajectory line and connected to the scanner suppression electrodes 34 and 38 and provided at a space interposed by electrode faces of the pair of scanning electrodes 36a and 36b opposed to each other. The electric correcting electrodes 36-1 and 36-2 are made to be at negative potentials the same as those of the scanner suppression electrodes 34 and 38.

Figure 8A:
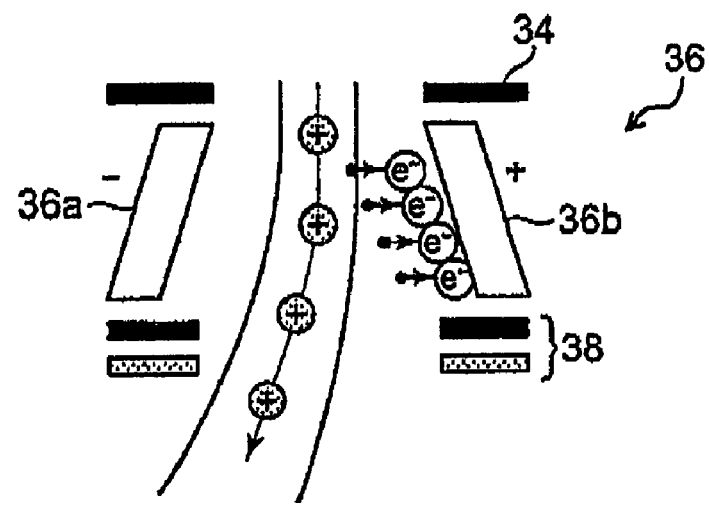
FIG. 8A through FIG. 8C are views for explaining an operation of the beam scanner shown in FIG. 7A.
Figure 8B:
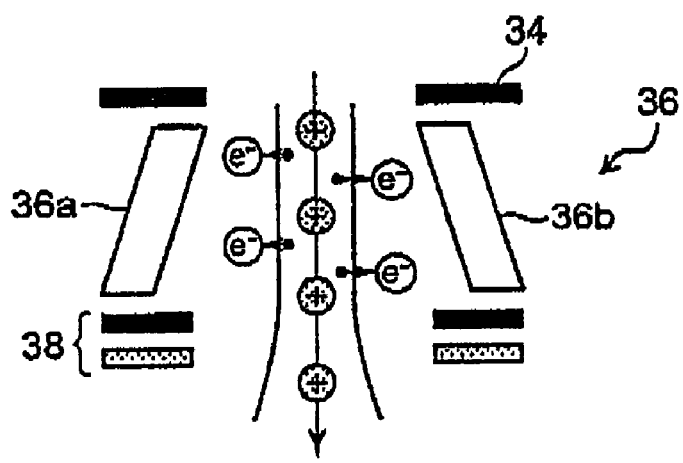
Figure 8C:
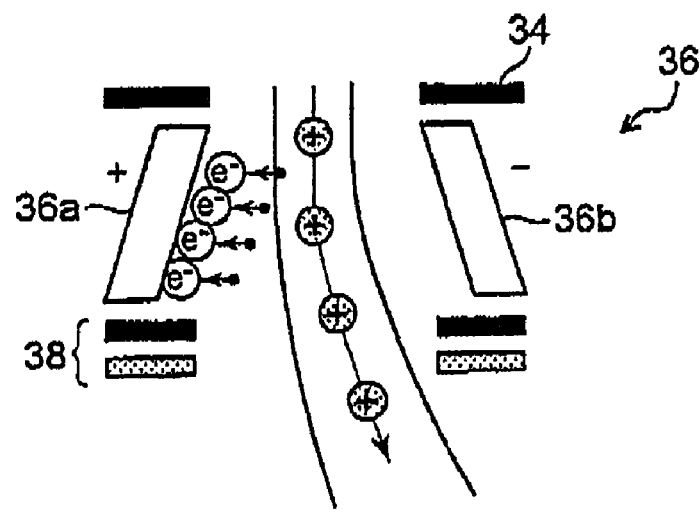

FIG. 8A through FIG. 8C are views for explaining an operation of restraining a zero electric field effect by the beam scanner 36, the beam scanner 36 is shown by a cross-sectional view and illustration of the electric field correcting electrode is omitted.

In FIG. 8A, an ion having a positive charge transmitting through the beam scanner 36 is attracted to the scanning electrode 36a on a left side having a negative voltage. On the other hand, an electron attached around the ion beam is attracted to the scanning electrode 36b on a right side having a positive voltage. Thereby, the ion beam passing through the beam scanner 36 loses electrons, the ions having the positive charge are repelled by each other by a space charge effect, and therefore, the ion beam tends to be diverged. The electron has a deflection angle larger than that of the ion since the mass thereof is lighter than that of the ion.

Also in FIG. 8C, the ion beam passing through the beam scanner 36 tends to be diverged by reason the same as that of FIG. 8A.

On the other hand, FIG. 8B shows a state of the ion beam at a instance at which voltages applied to the pair of scanning electrodes 36a and 36b connected to an alternating current scanning power source are just 0. Although the electron attached around the ion beam is not attracted by the scanning electrodes 36a and 36b, the electron is scattered in a random direction without remaining in the ion beam by an operation of a negative electric field from the electric field correcting electrodes 36-1 and 36-2. Thereby, a tendency of converging the ion beam by the remaining electron is restrained. The electric field correcting electrodes 36-1 and 36-2 are referred to also as zero electric field electrodes by such an operation.

Figure 7B:
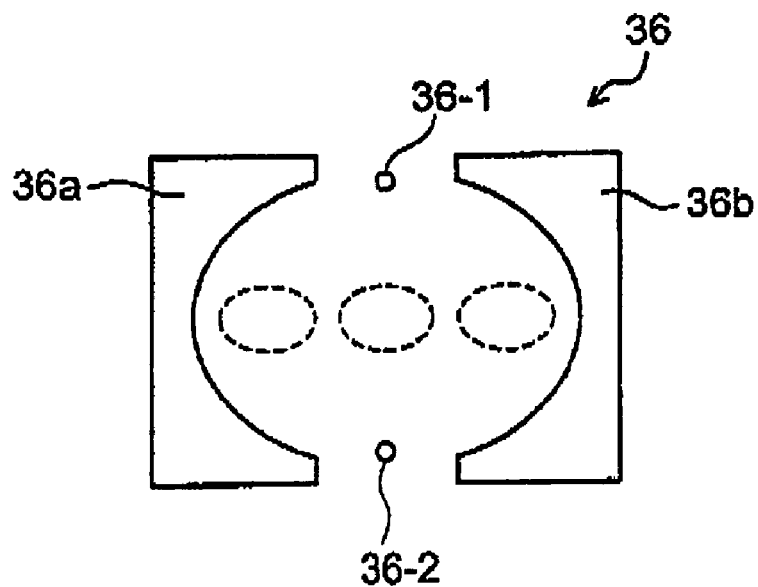
FIG. 7B is a view for explaining an electric field correcting electrode provided to the beam scanner.

At any rate, by the above-described operation of the electric field correcting electrodes 36-1 and 36-2, as shown by a broken line in FIG. 7B, a sectional shape of the ion beam is not changed to be uniform at either of scanning end portions and a scanning center portion on a downstream side of the beam scanner 36.

According to the beam scanner 36 including the zero electric field electrodes, so far as a beam scanning angle by the pair of scanning electrodes 36a and 36b is zero and there is not a difference between potentials of the left and right scanning electrodes, the zero electric field effect is made to be able to function as lateral direction converging means for alleviating converging in the longitudinal direction by the second quadrupole vertical focusing electromagnet 30 by the zero electric field effect.

Although an explanation has been given of the preferable embodiment of the ion implantation apparatus according to the present invention as described above, the ion implantation apparatus according to the present invention may be modified to realize as follows.

The constitution for making the extended length L2 of the second quadrupole vertical focusing electromagnet 30 twice as much as the extended length L1 of the first quadrupole vertical focusing electromagnet 24 in the direction of advancing the ion beam may be realized by aligning to arrange two constitutions the same as the first quadrupole vertical focusing electromagnet 24 in the direction of advancing the ion beam and connecting corresponding windings of the magnetic cores in series or in parallel.

The extended length L2 of the second quadrupole vertical focusing electromagnet 30 in the direction of advancing the ion beam may be twice as much as or more of the extended length L1 of the first quadrupole vertical focusing electromagnet 24.

According to the embodiment, the turn number of the winding 212 of the second quadrupole vertical focusing electromagnet 30 is the same the turn number of the winding 112 of the first quadrupole vertical focusing electromagnet 24. Instead thereof, by making the extended lengths in the direction of advancing the ion beam the same as each other, and making the turn number of the winding of the second quadrupole vertical focusing electromagnet 30 twice as much as or more of the turn number of the winding of the first quadrupole vertical focusing electromagnet 24, the magnet flux density may be increased and the effective magnetic field effect may be made to be twice or more.

According to the embodiment, the exciting voltages or currents made to flow to the windings of the first quadrupole vertical focusing electromagnet 24 and the second quadrupole vertical focusing electromagnet 30 are the same. Instead thereof, by making the extended lengths of the direction of advancing the ion beam the same as each other, and making the exciting voltage or current made to flow to the winding of the second quadrupole vertical focusing electromagnet 30 twice as much as or more of the exciting current made to flow to the winding of the first quadrupole vertical focusing electromagnet 24, the magnet flux density may be increased and the effective magnetic field effect may be doubled or more.

By making the diameter of the magnetic core of the second quadrupole vertical focusing electromagnet 30 larger than that of the first quadrupole vertical focusing electromagnet 24, the magnetic flux density may be increased and the effective magnetic field effect may be doubled or more.

By converging the ion beam in the longitudinal direction by a first quadrupole vertical focusing electromagnet and converging the ion beam in the lateral (left and right) direction by a second quadrupole lateral focusing electromagnet, there may be constructed a constitution in which the ion beam is converged in the longitudinal direction by the first quadrupole vertical focusing electromagnet and converging the ion beam in the lateral (left and right) direction by the second quadrupole lateral electromagnet in various conditions of the beam capable of supplying the optimum ion beam to the beam scanner. The various conditions of the beam signify an ion species, a beam amount, a beam energy and the like.

In various conditions of the beam capable of supplying the optimum ion beam to the beam scanner by converging the ion beam in the lateral direction by a first quadrupole lateral focusing electromagnet and converging the ion beam in the longitudinal direction by a second quadrupole vertical focusing electromagnet, there may be constructed a constitution in which the ion beam is converged in the lateral direction by the first quadrupole lateral focusing electromagnet and converging the ion beam in the longitudinal direction by the second quadrupole vertical focusing electromagnet.

In various conditions of the beam capable of supplying the optimum ion beam to the beam scanner 36 by converging the ion beam in the lateral direction by a first quadrupole lateral focusing electromagnet and a second quadrupole lateral focusing electromagnet, there may be constructed a constitution of converging the ion beam in the lateral direction by the first quadrupole lateral focusing electromagnet and the second quadrupole lateral focusing electromagnet.

Although in the embodiment, there is constructed a constitution of periodically and reciprocally scanning the ion beam in the horizontal direction orthogonal to the direction of advancing the ion beam, instead thereof, there may be constructed a constitution of periodically and reciprocally scanning the ion beam in a specific direction other than the horizontal direction, for example, in the vertical direction.

Although the embodiment is the case of applying the present invention to the ion implantation apparatus of a single wafer type, the present invention may be applied to an ion implantation apparatus of a batch type.

What is claimed is:

1. An ion implantation apparatus including a beam line of implanting an ion to a wafer by irradiating an ion beam extracted from an ion source and passed through a mass analysis magnet apparatus and a mass analysis slit to the wafer by being reciprocally scanned by a beam scanner;
    wherein the ion implantation apparatus is constituted such that the ion beam is converged and shaped by providing a first quadrupole focusing electromagnet at a section of the beam line from an outlet of the mass analysis magnet apparatus before incidence of the mass analysis slit, and by providing a second quadrupole focusing electromagnet having an effective magnetic field effect which is larger than an effective magnetic field effect of the first quadrupole focusing electromagnet at a section of the beam line from an outlet of the mass analysis slit before incidence of the beam scanner.

2. The ion implantation apparatus according to claim 1, wherein an effective magnetic field section in the beam line of the second quadrupole focusing electromagnet is longer than an effective magnetic field section of the first quadrupole focusing electromagnet.

3. The ion implantation apparatus according to claim 1, wherein the effective magnetic field effect is defined by a magnetic flux density.

4. The ion implantation apparatus according to claim 1, wherein the effective magnetic field effect is defined by a length of an effective magnetic field section having a uniform magnetic field.

5. The ion implantation apparatus according to claim 1, wherein the effective magnetic field effect is increased by making a diameter of a magnetic core of the second quadrupole focusing electromagnet larger than a diameter of a magnetic core of the first quadrupole focusing electromagnet.

6. The ion implantation apparatus according to claim 2, wherein the effective magnetic field effect is increased by making a magnetic core of the second quadrupole focusing electromagnet longer than a magnetic core of the first quadrupole focusing electromagnet in a direction of the beam line.

7. The ion implantation apparatus according to claim 3, wherein the effective magnetic field effect is increased by making a turn number of a winding of the second quadrupole focusing electromagnet larger than a turn number of a winding of the first quadrupole focusing electromagnet.

8. The ion implantation apparatus according to claim 3, wherein the effective magnetic field effect is increased by making an exciting voltage or current of the second quadrupole focusing electromagnet larger than an exciting voltage or current of the first quadrupole focusing electromagnet.

9. The ion implantation apparatus according to claim 1, wherein a magnitude of the effective magnetic field effect of the second quadrupole focusing electromagnet is made to be twice as much or more of a magnitude of the effective magnetic field effect of the first quadrupole focusing electromagnet.

10. The ion implantation apparatus according to claim 9, wherein the second quadrupole focusing electromagnet is constituted by aligning to arrange two of constitutions the same as the first quadrupole focusing electromagnet in the direction of the beam line.

11. The ion implantation apparatus according to claim 1, wherein the second quadrupole focusing electromagnet is constituted by an electromagnet for converging in a longitudinal direction and a range of converging the ion beam in the longitudinal direction is widened.

12. The ion implantation apparatus according to claim 1, wherein the first quadrupole focusing electromagnet and the second quadrupole focusing electromagnet are respectively electromagnets for converging in a longitudinal direction.

13. The ion implantation apparatus according to claim 1, wherein the first quadrupole focusing electromagnet and the second quadrupole focusing electromagnet are respectively an electromagnet for converging in a longitudinal direction and an electromagnet for converging in a lateral direction.

14. The ion implantation apparatus according to claim 1, wherein the first quadrupole focusing electromagnet and the second quadrupole focusing electromagnet are respectively an electromagnet for converging in a lateral direction and an electromagnet for converging in a longitudinal direction.

15. The ion implantation apparatus according to claim 1, wherein the first quadrupole focusing electromagnet and the second quadrupole focusing electromagnet are respectively electromagnets for converging in a lateral direction.

16. The ion implantation apparatus according to claim 1, wherein the second quadrupole focusing electromagnet is arranged at a position of a middle state of converging and diverging the ion beam, on the section of the beam line from the outlet of the mass analysis slit to the inlet of the beam scanner.

17. The ion implantation apparatus according to claim 1, wherein the second quadrupole focusing electromagnet is an electromagnet for converging in a longitudinal direction;
   wherein the beam scanner includes a pair of scanning electrodes arranged by interposing the ion beam, scanner suppression electrodes respectively provided at a vicinity on an upstream side and at a vicinity on a downstream side of the pair of scanning electrodes, and a pair of electric field correcting electrodes connected to the scanner suppression electrodes and provided at a space interposed by electrode faces of the pair of scanning electrodes opposed to each other; and
   wherein the beam scanner is made to be operated as a lateral direction converging means for alleviating conversion in a longitudinal direction of the second quadrupole focusing electromagnet by a zero electric field effect when a beam scanning angle by the pair of scanning electrodes is zero.

18. The ion implantation apparatus according to claim 1, wherein a steering coil for adjusting a beam position of the ion beam in the lateral direction is arranged at a position on an upstream side adjacent to an inlet of the second quadrupole focusing electromagnet.

19. A method of converging and shaping an ion beam in an ion implantation apparatus, the method being applied to an ion implantation apparatus for implanting an ion to a wafer by irradiating an ion beam extracted from an ion source and passed through a mass analysis magnet apparatus and a mass analysis slit to the wafer by reciprocally scanning the ion beam with a beam scanner;
   wherein the ion beam is converged in a longitudinal direction by a first quadrupole focusing electromagnet arranged at a section of a beam line from an outlet of the mass analysis magnet apparatus before incidence of the mass analysis slit; and
   wherein the ion beam is made to be able to be shaped to a sectional shape suitable for the beam scanner by further converging the ion beam in a longitudinal direction by a second quadrupole focusing electromagnet arranged at a section of the beam line from an outlet of the mass analysis slit before incidence of the beam scanner and having an effective magnetic field effect larger than an effective magnetic field effect of the first quadrupole focusing electromagnet.

* * * * *